US008933755B2

(12) United States Patent
Cheng et al.

(10) Patent No.: US 8,933,755 B2
(45) Date of Patent: Jan. 13, 2015

(54) UNITY-GAIN BUFFER WITH ENHANCED SLEW RATE

(71) Applicant: Orise Technology Co., Ltd., Hsinchu (TW)

(72) Inventors: Yen-Cheng Cheng, Hsinchu (TW); Chien-Chun Huang, Hsinchu (TW); Kuan-Han Chen, Hsinchu (TW)

(73) Assignee: Orise Technology Co., Ltd., Hsinchu (TW)

( * ) Notice: Subject to any disclaimer, the term of this patent is extended or adjusted under 35 U.S.C. 154(b) by 74 days.

(21) Appl. No.: 13/939,493

(22) Filed: Jul. 11, 2013

(65) Prior Publication Data

US 2014/0028396 A1  Jan. 30, 2014

(30) Foreign Application Priority Data

Jul. 24, 2012  (TW) .............................. 101126654 A

(51) Int. Cl.
H03F 3/18 (2006.01)
H03F 3/45 (2006.01)
H03F 3/50 (2006.01)

(52) U.S. Cl.
CPC ............. *H03F 3/45179* (2013.01); *H03F 3/50* (2013.01); *H03F 3/45475* (2013.01); *H03F 2203/45248* (2013.01)
USPC ......................................... 330/264; 330/251

(58) Field of Classification Search
USPC ................................ 330/264, 251, 207 A, 261
See application file for complete search history.

(56) References Cited

U.S. PATENT DOCUMENTS

| 5,218,315 | A  | * | 6/1993 | Turner ............................ 330/10 |
| 6,683,496 | B2 |   | 1/2004 | Poggi et al. |
| 6,745,016 | B2 |   | 6/2004 | Iwata et al. |
| 7,339,430 | B2 |   | 3/2008 | Chiu |
| 7,863,982 | B2 |   | 1/2011 | Chen et al. |
| 2005/0024139 | A1 | * | 2/2005 | Botti et al. ..................... 330/251 |
| 2008/0024213 | A1 | * | 1/2008 | Magrath ........................ 330/96 |
| 2013/0038391 | A1 | * | 2/2013 | Hlibowicki ................... 330/251 |

* cited by examiner

*Primary Examiner* — Henry Choe
(74) *Attorney, Agent, or Firm* — WPAT, PC; Justin King

(57) ABSTRACT

A unity-gain buffer includes an operational amplifier, a control stage, and an auxiliary output stage. The operational amplifier includes a non-inverting input terminal, an output terminal, and an inverting input terminal. The control stage is connected between the non-inverting input terminal and the output terminal of the unity-gain buffer. The auxiliary output stage is connected between the control stage and the output terminal of the unity-gain buffer. According to an input voltage at the input terminal of the unity-gain buffer, the control stage generates a first driving current, the auxiliary output stage generates a second driving current, and the operational amplifier generates a third driving current, so that an overall driving current outputted from the output terminal of the unity-gain buffer is equal to the sum of the first driving current, the second driving current and the third driving current.

20 Claims, 7 Drawing Sheets

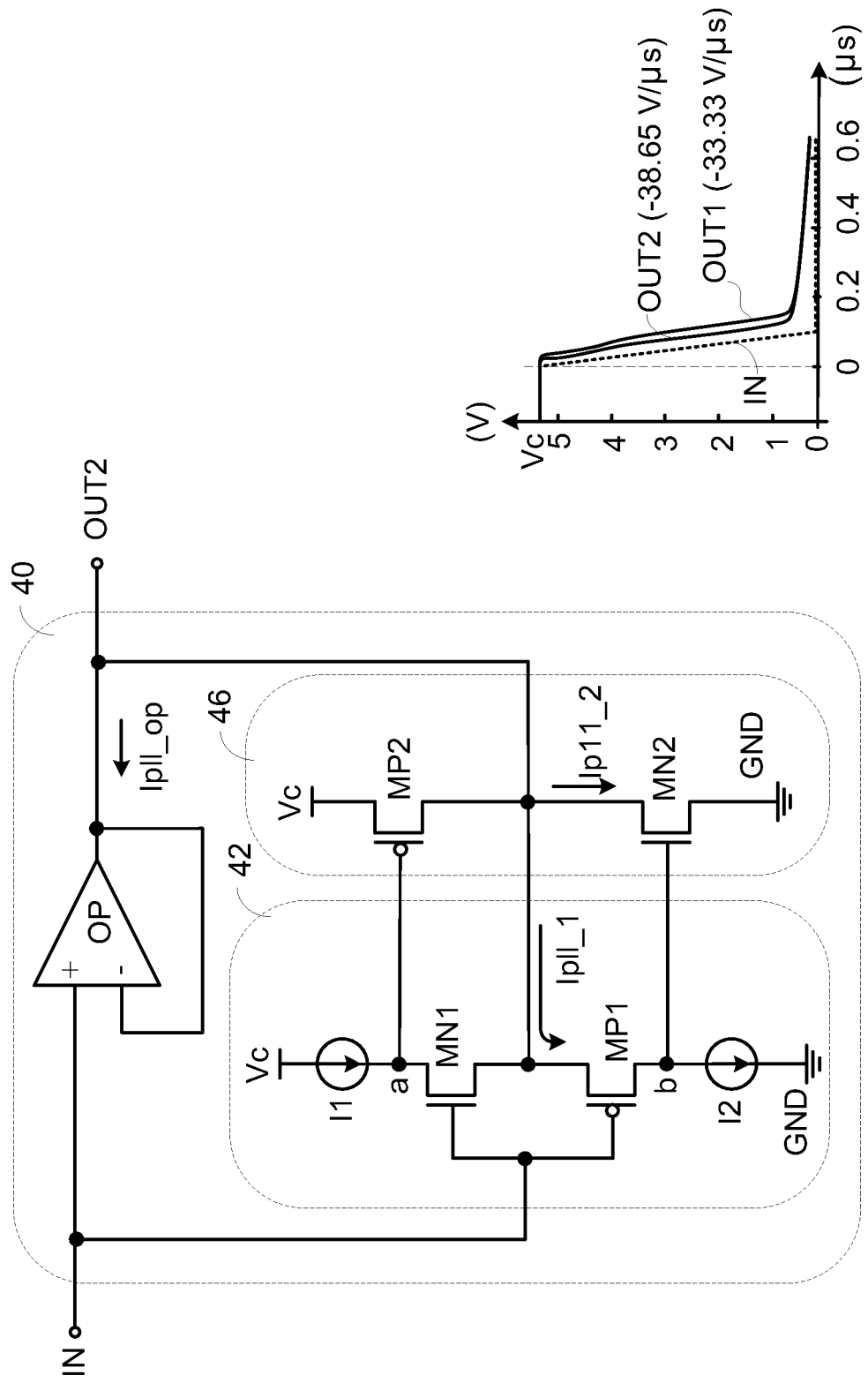

UNITY-GAIN BUFFER WITH ENHANCED SLEW RATE

This application claims the benefit of Taiwan Patent Application No. 101126654, filed Jul. 24, 2012, the subject matter of which is incorporated herein by reference.

FIELD OF THE INVENTION

The present invention relates to a unity-gain buffer, and more particularly to a unity-gain buffer with an enhanced slew rate.

BACKGROUND OF THE INVENTION

An operational amplifier is a widely-used component of a circuitry. The operational amplifier has a non-inverting input terminal (+), an inverting input terminal (−), and an output terminal. The operational amplifier may be constituted as a unity-gain buffer, also known as a unity-gain follower. FIG. 1A is a schematic circuit diagram of a typical unity-gain buffer. FIG. 1B is a plot illustrating associated signal of the unity-gain buffer of FIG. 1A. Please refer to FIGS. 1A and 1B. In the unity-gain buffer 10, the inverting input terminal (−) of the operational amplifier OP is connected with the output terminal of the operational amplifier OP. The non-inverting input terminal (+) of the operational amplifier OP is served as the input terminal IN of the unity-gain buffer 10 for receiving an input signal. The output terminal of the operational amplifier OP is served as the output terminal OUT of the unity-gain buffer 10.

The unity gain buffer 10 has a voltage gain of unity. That is, the output voltage at the output terminal OUT is equal to the input voltage at the input terminal IN. As shown in FIG. 1B, if a step function is received by the input terminal IN, the input voltage rises up from 0V to Vc at the time spot t0. Since the output voltage at the output terminal OUT fails to instantly respond to the change of the input terminal IN, the output voltage at the output terminal OUT is 0V at the time spot t0 and gradually rises up to Vc. Moreover, the rising slope of the output voltage at the output terminal OUT is also referred as a slew rate.

FIG. 2 is a schematic circuit diagram illustrating an output stage of an operational amplifier. Generally, the last stage of the operational amplifier OP is an output stage, which is a Class-AB output stage. As shown in FIG. 2, the output stage comprises a P-type transistor MPo and an N-type transistor MNo. The drain terminal of the P-type transistor MPo and the drain terminal of the N-type transistor MNo are collectively connected with the output terminal of the operational amplifier OP. Basically, the output stage may output a driving current. The driving current may be a push current or a pull current. The ways of outputting the push current or a pull current will be illustrated as follows.

Take a unity gain buffer for example. If the input voltage at the input terminal IN is higher than the output voltage at the output terminal OUT, the P-type transistor MPo of the output stage is turned on, but the N-type transistor MNo of the output stage is turned off. Under this circumstance, a push current Ipsh_op flows from the P-type transistor MPo to the output terminal OUT. Whereas, if the input voltage at the input terminal IN is lower than the output voltage at the output terminal OUT, the P-type transistor MPo of the output stage is turned off, but the N-type transistor MNo of the output stage is turned on. Under this circumstance, a pull current Ipll_op flows from the output terminal OUT to the N-type transistor MNo. That is, when the P-type transistor MPo is turned on, only the push current Ipsh_op is generated, but the pull current Ipll_op is not generated. Whereas, when the N-type transistor MNo is turned on, only the pull current Ipll_op is generated, but the push current Ipsh_op is not generated.

Since the output voltage of the operational amplifier OP has limited driving capability, the slew rate is about several volts per microsecond (V/μs). Therefore, there is a need of providing a unity-gain buffer with an enhanced slew rate.

SUMMARY OF THE INVENTION

The present invention provides a unity-gain buffer with an auxiliary output stage to increase the push current and the pull current in order to enhance an enhanced slew rate.

An embodiment of the present invention provides a unity-gain buffer. The unity-gain buffer includes an operational amplifier, a control stage, and an auxiliary output stage. The operational amplifier includes a non-inverting input terminal, an output terminal, and an inverting input terminal. The non-inverting input terminal is served as an input terminal of the unity-gain buffer. The output terminal of the operational amplifier is served as an output terminal of the unity-gain buffer. The inverting input terminal is connected with the output terminal of the unity-gain buffer. The control stage is connected between the non-inverting input terminal and the output terminal of the unity-gain buffer. The auxiliary output stage is connected between the control stage and the output terminal of the unity-gain buffer. According to an input voltage at the input terminal of the unity-gain buffer, the control stage generates a first driving current, the auxiliary output stage generates a second driving current, and the operational amplifier generates a third driving current, so that an overall driving current outputted from the output terminal of the unity-gain buffer is equal to the sum of the first driving current, the second driving current and the third driving current.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 4A~4D schematically illustrate the configurations of a unity-gain buffer and associated signals according to a first embodiment of the present invention;

DETAILED DESCRIPTION OF PREFERRED EMBODIMENTS

The present invention provides a unity-gain buffer with an enhanced slew rate. For enhancing the slew rate, an auxiliary output stage is arranged between the non-inverting input terminal (+) and the output terminal of the operational amplifier OP in order to increase the push current and the pull current of the operational amplifier OP.

Figure 2:
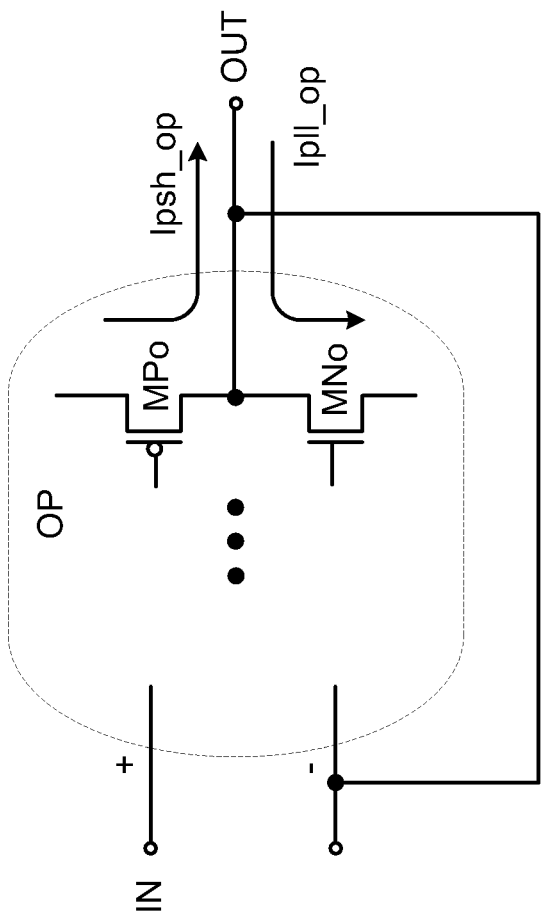
FIG. 2 (prior art) is a schematic circuit diagram illustrating an output stage of an operational amplifier.
Figure 1A:
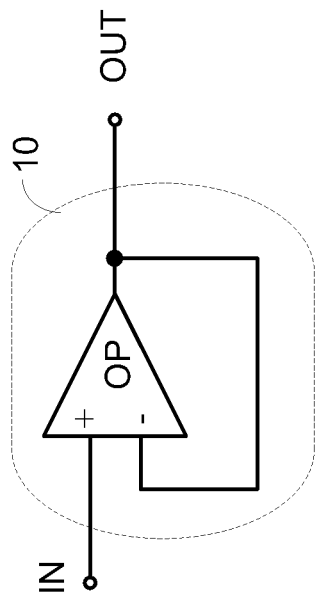
FIG. 1A (prior art) is a schematic circuit diagram of a typical unity-gain buffer.
Figure 1B:
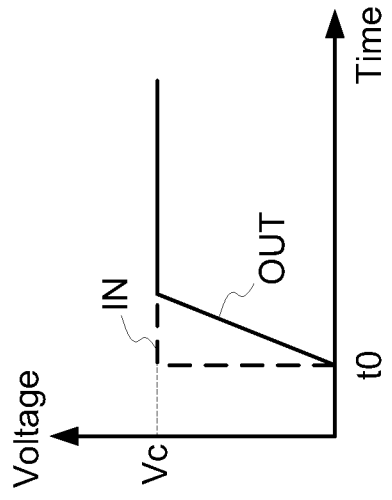
FIG. 1B (prior art) is a plot illustrating associated signal of the unity-gain buffer of FIG. 1A.
Figures 3A, 3B:
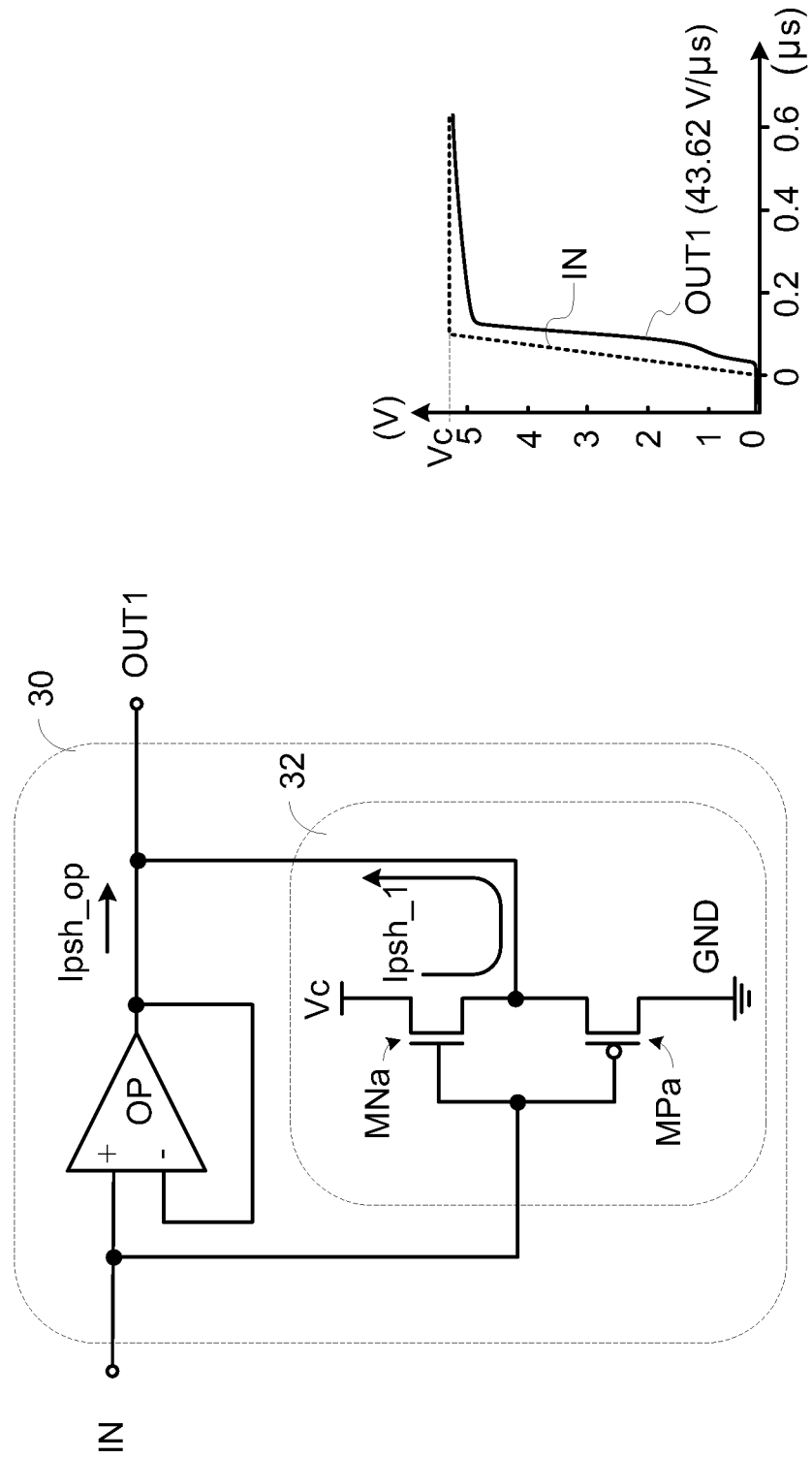
FIGS. 3A~3D schematically illustrate the configurations of a unity-gain buffer with an auxiliary output stage and associated signals according to an embodiment of the present invention.

FIGS. 3A~3D schematically illustrate the configurations of a unity-gain buffer with an auxiliary output stage and associated signals according to an embodiment of the present invention. As shown in FIG. 3A, the unity-gain buffer 30 comprises an operational amplifier OP and an auxiliary output stage 32. The non-inverting input terminal (+) of the operational amplifier OP is served as the input terminal IN of the unity-gain buffer 30. The output terminal of the operational amplifier OP is served as the output terminal OUT1 of the unity-gain buffer 30. In addition, the output terminal of the operational amplifier OP is connected with the inverting input terminal (−) of the operational amplifier OP.

The auxiliary output stage 32 comprises an N-type transistor MNa and a P-type transistor MPa. The gate terminal of the N-type transistor MNa is connected with the input terminal IN of the unity-gain buffer 30. The drain terminal of the N-type transistor MNa is connected with a power voltage Vc. The source terminal of the N-type transistor MNa is connected with the output terminal OUT1 of the unity-gain buffer 30. The drain terminal of the P-type transistor MPa is connected with a ground voltage GND. The source terminal of the P-type transistor MPa is connected with the output terminal OUT1 of the unity-gain buffer 30.

Please refer to FIGS. 3A and 3B. During the input voltage at the input terminal IN of the unity-gain buffer 30 rises up from 0V to Vc, the N-type transistor MNa is turned on, but the P-type transistor MPa is turned off. Consequently, the output voltage at the output terminal OUT1 of the unity-gain buffer 30 rises up from 0V to Vc. Under this circumstance, an auxiliary push current Ipsh_1 flows from the power voltage Vc to the output terminal OUT1 of the unity-gain buffer 30 through the N-type transistor MNa. Meanwhile, the overall push current outputted from the output terminal OUT1 of the unity-gain buffer 30 is equal to the sum of the push current Ipsh_op from the operational amplifier OP and the auxiliary push current Ipsh_1. Consequently, the rising slew rate is enhanced.

Figures 3C, 3D:
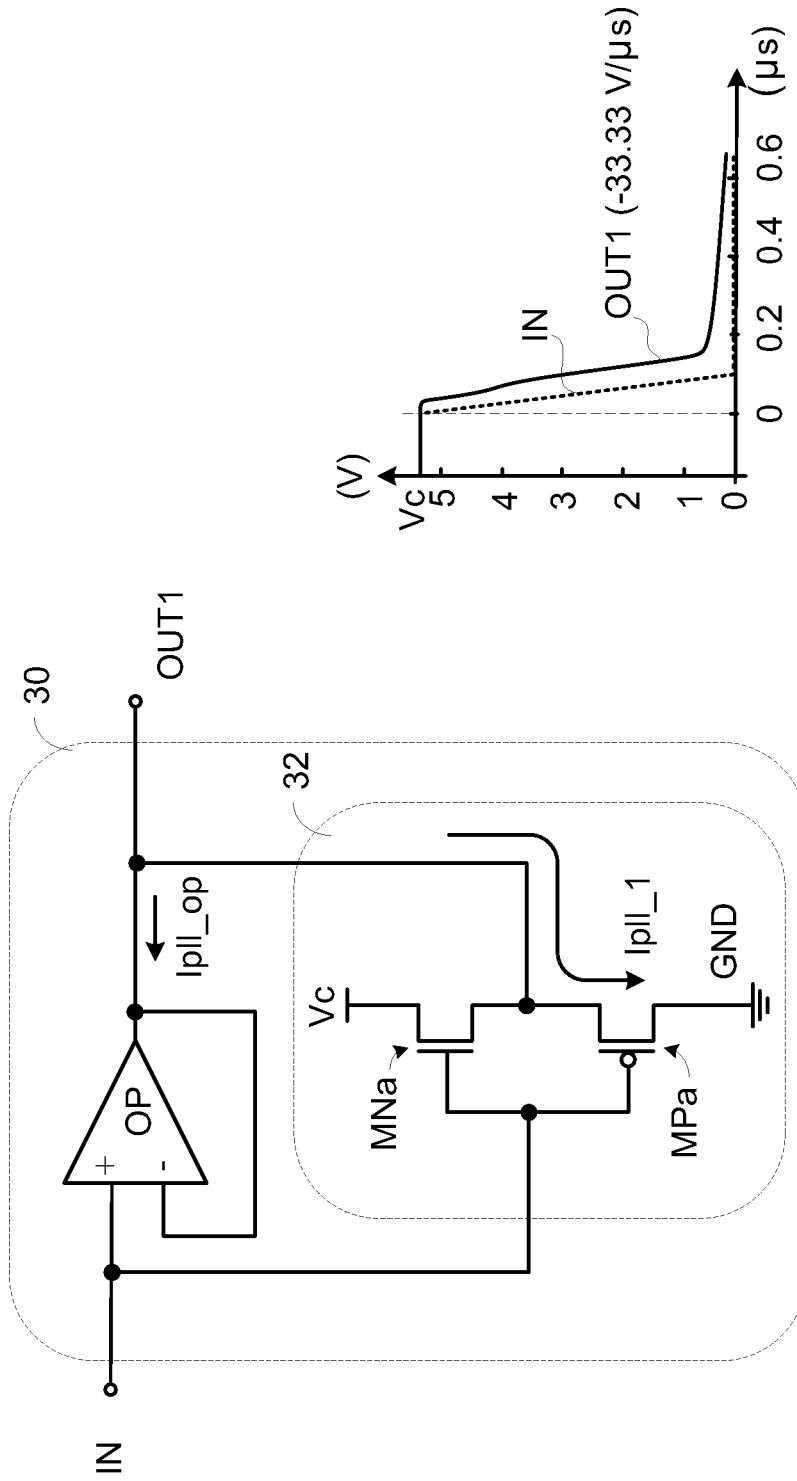

Please refer to FIGS. 3C and 3D. During the input voltage at the input terminal IN of the unity-gain buffer 30 falls down from Vc to 0V, the P-type transistor MPa is turned on, but the N-type transistor MNa is turned off. Consequently, the output voltage at the output terminal OUT1 of the unity-gain buffer 30 falls down from Vc to 0V. Under this circumstance, an auxiliary pull current Ipll_1 flows from the output terminal OUT1 of the unity-gain buffer 30 to the ground terminal GND through the P-type transistor MPa. Meanwhile, the overall pull current outputted from the output terminal OUT1 of the unity-gain buffer 30 is equal to the sum of the pull current Ipll_op from the operational amplifier OP and the auxiliary pull current Ipll_1. Consequently, the falling slew rate is enhanced.

From the above description, the output terminal OUT1 of the unity-gain buffer 30 generates the push current during the output voltage at the output terminal OUT1 of the unity-gain buffer 30 rises up from 0V to Vc, and the output terminal OUT1 of the unity-gain buffer 30 generates the pull current during the output voltage at the output terminal OUT1 of the unity-gain buffer 30 falls down from Vc to 0V.

Moreover, as shown in FIG. 3B, during the input voltage at the input terminal IN of the unity-gain buffer 30 rises up from 0V to Vc, the rising slew rate of the output voltage at the output terminal OUT1 of the unity-gain buffer 30 is 43.62V/μs. Moreover, as shown in FIG. 3D, during the input voltage at the input terminal IN of the unity-gain buffer 30 falls down up from Vc to 0V, the falling slew rate of the output voltage at the output terminal OUT1 of the unity-gain buffer 30 is −33.33V/μs. Obviously, the slew rate of the unity-gain buffer 30 is effectively enhanced.

However, in the auxiliary output stage 32 of the unity-gain buffer 30, the N-type transistor MNa is connected between the power voltage Vc and the output terminal OUT1 of the unity-gain buffer 30, and the P-type transistor MPa is connected between the output terminal OUT1 of the unity-gain buffer 30 and the ground voltage GND. Consequently, the N-type transistor MNa and the P-type transistor MPa may result in a body effect. For reducing the influence of the body effect, the sizes of the N-type transistor MNa and the P-type transistor MPa should be increased to allow the N-type transistor MNa and the P-type transistor MPa to provide sufficient auxiliary push current Ipsh_1 and auxiliary pull current Ipll_1.

However, in a case that the sizes of the N-type transistor MNa and the P-type transistor MPa are increased, the equivalent capacitance value of the N-type transistor MNa and the P-type transistor MPa is increased. Under this circumstance, the output voltage at the output terminal OUT1 of the unity-gain buffer 30 and the input voltage at the input terminal IN of the unity-gain buffer 30 are suffered from signal coupling, and thus the operations of the whole unity-gain buffer 30 become unstable.

Figure 4B:
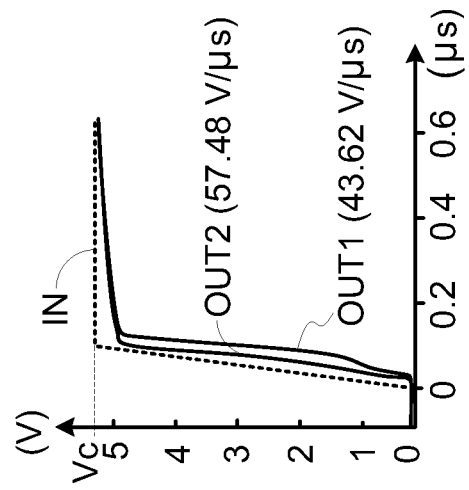
Figure 4A:
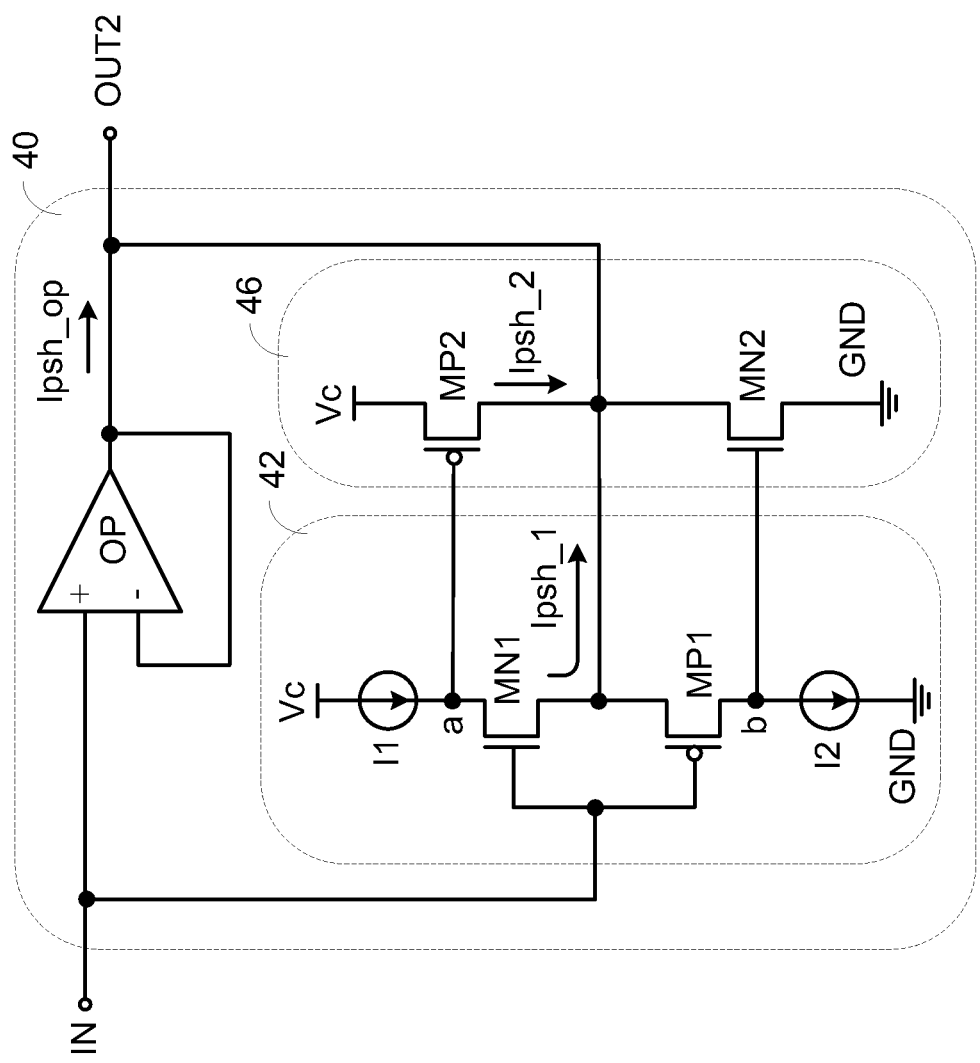

FIGS. 4A-4D schematically illustrate the configurations of a unity-gain buffer and associated signals according to a first embodiment of the present invention. As shown in FIG. 4A, the unity-gain buffer 40 comprises an operational amplifier OP, a control stage 42, and an auxiliary output stage 46. The non-inverting input terminal (+) of the operational amplifier OP is served as the input terminal IN of the unity-gain buffer 40. The output terminal of the operational amplifier OP is served as the output terminal OUT2 of the unity-gain buffer 40. In addition, the output terminal of the operational amplifier OP is connected with the inverting input terminal (−) of the operational amplifier OP.

Furthermore, the control stage 42 comprises a first current source I1, a second current source I2, a first N-type transistor MN1, and a first P-type transistor MP1. The first current source I1 is connected between a power voltage Vc and a first node a. The gate terminal of the first N-type transistor MN1 is connected with the input terminal IN of the unity-gain buffer 40. The source terminal of the first N-type transistor MN1 is connected with the output terminal OUT2 of the unity-gain buffer 40. The drain terminal of the first N-type transistor MN1 is connected with the first node a. The second current source I2 is connected between a ground terminal GND and a second node b. The gate terminal of the first P-type transistor MP1 is connected with the input terminal IN of the unity-gain buffer 40. The drain terminal of the first P-type transistor MP1 is connected with the second node b. The source terminal of the first P-type transistor MP1 is connected with the output terminal OUT2 of the unity-gain buffer 40.

The auxiliary output stage 46 comprises a second P-type transistor MP2 and a second N-type transistor MN2. The gate terminal of the second P-type transistor MP2 is connected with the first note a. The source terminal of the second P-type transistor MP2 is connected with the power voltage Vc. The drain terminal of the second P-type transistor MP2 is connected with the output terminal OUT2 of the unity-gain buffer 40. The gate terminal of the second N-type transistor MN2 is connected with the second node b. The source terminal of the second N-type transistor MN2 is connected with the ground voltage GND. The drain terminal of the second N-type transistor MN2 is connected with the output terminal OUT2 of the unity-gain buffer 40.

Moreover, as shown in FIGS. 4A and 4B, during the input voltage at the input terminal IN of the unity-gain buffer 40 rises up from 0V to Vc, the first N-type transistor MN1 of the control stage 42 is turned on, but the first P-type transistor MP1 of the control stage 42 is turned off. Consequently, the voltage at the first node a is decreased, and the second P-type transistor MP2 of the auxiliary output stage 46 is turned on. Under this circumstance, the output voltage at the output terminal OUT2 of the unity-gain buffer 40 rises up from 0V to Vc. As shown in FIG. 4A, the overall push current outputted from the output terminal OUT2 of the unity-gain buffer 40 is equal to the sum of the push current Ipsh_op from the operational amplifier OP, a first auxiliary push current Ipsh_1 from the control stage 42 and a second auxiliary push current Ipsh_2 from the auxiliary output stage 46. Consequently, the rising slew rate is enhanced.

Moreover, as shown in FIGS. 4C and 4D, during the input voltage at the input terminal IN of the unity-gain buffer 40 falls down from Vc to 0V, the first P-type transistor MP1 of the control stage 42 is turned on, but the first N-type transistor MN1 of the control stage 42 is turned off. Consequently, the voltage at the second node b is increased, and the second N-type transistor MN2 of the auxiliary output stage 46 is turned on. Under this circumstance, the output voltage at the output terminal OUT2 of the unity-gain buffer 40 falls down from Vc to 0V. As shown in FIG. 4C, the overall push current outputted from the output terminal OUT2 of the unity-gain buffer 40 is equal to the sum of the pull current Ipll_op from the operational amplifier OP, a first auxiliary pull current Ipll_1 from the control stage 42 and a second auxiliary pull current Ipll_2 from the auxiliary output stage 46. Consequently, the falling slew rate is enhanced.

Moreover, as shown in FIG. 4B, during the input voltage at the input terminal IN of the unity-gain buffer 40 rises up from 0V to Vc, the rising slew rate of the output voltage at the output terminal OUT2 of the unity-gain buffer 40 is 57.62V/μs, which is higher than the rising slew rate of the output voltage at the output terminal OUT1 of the unity-gain buffer 30 of FIG. 3A. Moreover, as shown in FIG. 4D, during the input voltage at the input terminal IN of the unity-gain buffer 40 falls down from Vc to 0V, the falling slew rate of the output voltage at the output terminal OUT2 of the unity-gain buffer 40 is −38.65V/μs, which is lower than the falling slew rate of the output voltage at the output terminal OUT1 of the unity-gain buffer 30 of FIG. 3D. In comparison with the unity-gain buffer 30 of FIGS. 3A and 3C, the slew rate is largely enhanced.

From the above description, the control stage 42 is only used for controlling the auxiliary output stage 46. Consequently, the sizes of the first N-type transistor MN1 and the first P-type transistor MP1 are similar to the normal size of the general transistors without the need of being increased. Moreover, since the equivalent capacitance value of the first N-type transistor MN1 and the first P-type transistor MP1 is low, the signal coupling problem will be minimized. In such way, the operations of the unity-gain buffer 40 become more stable.

Figure 5B:
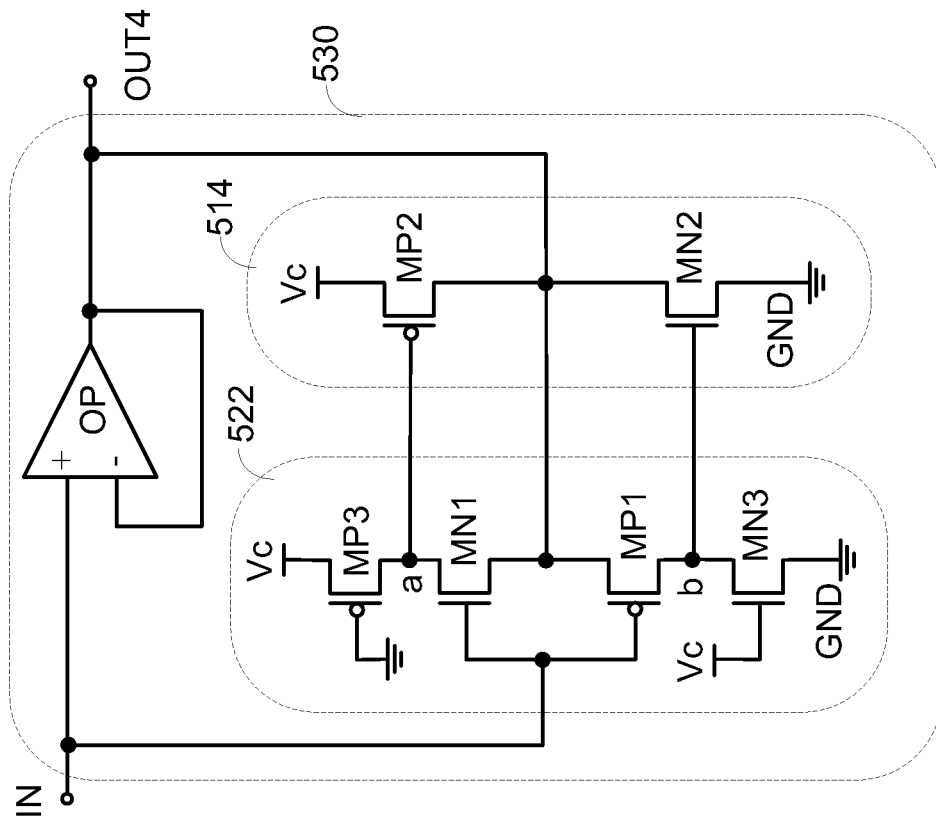
FIGS. 5A~5C schematically illustrate some exemplary current sources for implementing the control stage of the unity-gain buffer of the present invention.
Figure 5A:
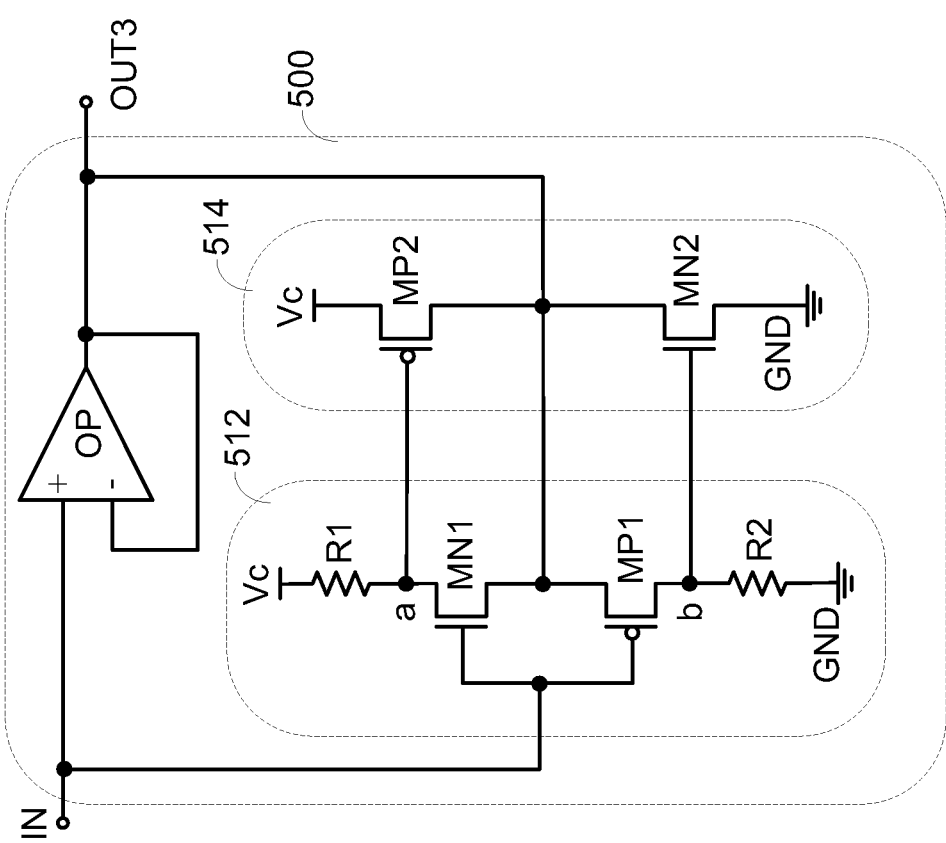
Figure 5C:
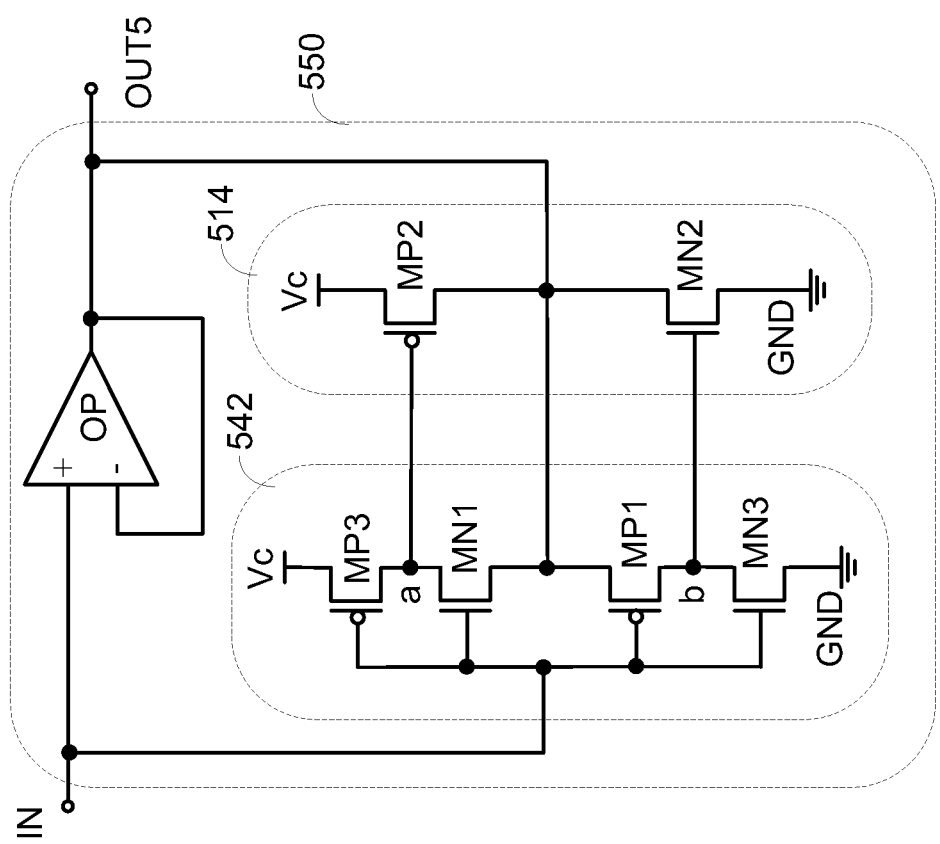

FIGS. 5A~5C schematically illustrate some exemplary current sources for implementing the control stage of the unity-gain buffer of the present invention.

The configurations and functions of the operational amplifier OP and the auxiliary output stage 514 of the unity-gain buffer 500 of FIG. 5A are similar to those of the operational amplifier OP and the auxiliary output stage 46 of the unity-gain buffer 40 of FIG. 4A, and are not redundantly described herein. In comparison with the unity-gain buffer 40 of FIG. 4A, the control stage 512 of the unity-gain buffer 500 of FIG. 5A is distinguished. That is, a first resistor R1 between the power voltage Vc and the first node a constitutes the first current source, and a second resistor R2 between the ground voltage GND and the second node b constitutes the second current source.

Similarly, the configurations and functions of the operational amplifier OP and the auxiliary output stage 514 of the unity-gain buffer 530 shown in FIG. 5B are similar to those of the operational amplifier OP and the auxiliary output stage 46 of the unity-gain buffer 40 of FIG. 4A, and are not redundantly described herein. In comparison with the unity-gain buffer 40 of FIG. 4A, the control stage 522 of the unity-gain buffer 530 of FIG. 5B is distinguished. The first current source is defined by a third P-type transistor MP3. The gate terminal of the third P-type transistor MP3 is connected with the ground voltage GND. The source terminal of the third P-type transistor MP3 is connected with the power voltage Vc. The drain terminal of the third P-type transistor MP3 is connected with the first node a. The second current source is defined by a third N-type transistor MN3. The gate terminal of the third N-type transistor MN3 is connected with the power voltage Vc. The source terminal of the third N-type transistor MN3 is connected with the ground voltage GND. The drain terminal of the third N-type transistor MN3 is connected with the second node b.

Similarly, the configurations and functions of the operational amplifier OP and the auxiliary output stage 514 of the unity-gain buffer 550 of FIG. 5C are similar to those of the operational amplifier OP and the auxiliary output stage 46 of the unity-gain buffer 40 of FIG. 4A, and are not redundantly described herein. In comparison with the unity-gain buffer 40 of FIG. 4A, the control stage 542 of the unity-gain buffer 550 of FIG. 5C is distinguished. The first current source is defined by a third P-type transistor MP3. The gate terminal of the third P-type transistor MP3 is connected with the input terminal IN of the unity-gain buffer 550. The source terminal of the third P-type transistor MP3 is connected with the power voltage Vc. The drain terminal of the third P-type transistor MP3 is connected with the first node a. The second current source is defined by a third N-type transistor MN3. The gate terminal of the third N-type transistor MN3 is connected with the input terminal IN of the unity-gain buffer 550. The source terminal of the third N-type transistor MN3 is connected with the ground voltage GND. The drain terminal of the third N-type transistor MN3 is connected with the second node b.

It is noted that numerous modifications or alternations of the unity-gain buffer of the first embodiment may be made while retaining the teachings of the present invention. For example, the unity-gain buffer of the present invention may be designed to enhance the rising slew rate or the falling slew rate only.

Figure 6A:
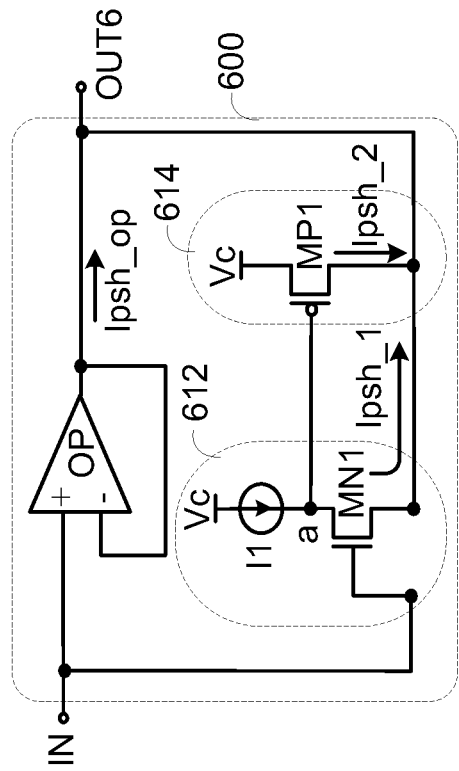
FIG. 6A schematically illustrates the configurations of a unity-gain buffer according to a second embodiment of the present invention.

FIG. 6A schematically illustrates the configurations of a unity-gain buffer according to a second embodiment of the present invention. The unity-gain buffer of the second embodiment is designed to enhance the rising slew rate. As shown in FIG. 6A, the unity-gain buffer 600 comprises an operational amplifier OP, a control stage 612, and an auxiliary output stage 614. The non-inverting input terminal (+) of the operational amplifier OP is served as the input terminal IN of the unity-gain buffer 600. The output terminal of the operational amplifier OP is served as the output terminal OUT6 of the unity-gain buffer 600. In addition, the output terminal of the operational amplifier OP is connected with the inverting input terminal (−) of the operational amplifier OP.

Furthermore, the control stage 612 comprises a first current source I1 and a first N-type transistor MN1. The first current source I1 is connected between a power voltage Vc and a first node a. The gate terminal of the first N-type transistor MN1 is connected with the input terminal IN of the unity-gain buffer 600. The source terminal of the first N-type transistor MN1 is connected with the output terminal OUT6 of the unity-gain buffer 600. The drain terminal of the first N-type transistor MN1 is connected with the first node a.

The auxiliary output stage 614 comprises a first P-type transistor MP1. The gate terminal of the first P-type transistor MP1 is connected with the first note a. The source terminal of the first P-type transistor MP1 is connected with the power voltage Vc. The drain terminal of the first P-type transistor MP1 is connected with the output terminal OUT6 of the unity-gain buffer 600. During the input voltage at the input terminal IN of the unity-gain buffer 600 rises up from 0V to Vc, the first N-type transistor MN1 of the control stage 612 is turned on. Under this circumstance, the output voltage at the output terminal OUT6 of the unity-gain buffer 600 rises up from 0V to Vc.

As shown in FIG. 6A, the overall push current outputted from the output terminal OUT6 of the unity-gain buffer 600 is equal to the sum of the push current Ipsh_op from the operational amplifier OP, a first auxiliary push current Ipsh_1 from the control stage 612 and a second auxiliary push current Ipsh_2 from the auxiliary output stage 614. Consequently, the rising slew rate is enhanced.

Moreover, during the input voltage at the input terminal IN of the unity-gain buffer 600 falls down from Vc to 0V, only the operational amplifier OP generates the pull current. Consequently, the output voltage at the output terminal OUT6 of the unity-gain buffer 600 slowly falls down from Vc to 0V.

Figure 6B:
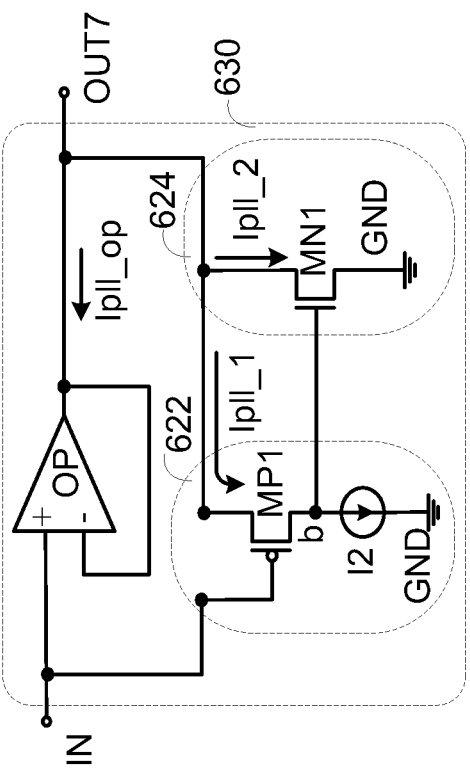
FIG. 6B schematically illustrates the configurations of a unity-gain buffer according to a third embodiment of the present invention.

FIG. 6B schematically illustrates the configurations of a unity-gain buffer according to a third embodiment of the present invention. The unity-gain buffer of the third embodiment is designed to enhance the falling slew rate. As shown in FIG. 6B, the unity-gain buffer 630 comprises an operational amplifier OP, a control stage 622, and an auxiliary output stage 624. The non-inverting input terminal (+) of the operational amplifier OP is served as the input terminal IN of the unity-gain buffer 630. The output terminal of the operational amplifier OP is served as the output terminal OUT7 of the unity-gain buffer 630. In addition, the output terminal of the operational amplifier OP is connected with the inverting input terminal (−) of the operational amplifier OP.

Furthermore, the control stage 622 comprises a second current source I2 and a first P-type transistor MP1. The second current source I2 is connected between a ground terminal GND and a second node b. The gate terminal of the first P-type transistor MP1 is connected with the input terminal IN of the unity-gain buffer 630. The drain terminal of the first P-type transistor MP1 is connected with the second node b. The source terminal of the first P-type transistor MP1 is connected with the output terminal OUT7 of the unity-gain buffer 630.

The auxiliary output stage 614 comprises a first N-type transistor MN1. The gate terminal of the first N-type transistor MN1 is connected with the second node b. The source terminal of the first N-type transistor MN1 is connected with the ground voltage GND. The drain terminal of the first N-type transistor MN1 is connected with the output terminal OUT7 of the unity-gain buffer 630.

During the input voltage at the input terminal IN of the unity-gain buffer 630 falls down from Vc to 0V, the first P-type transistor MP1 of the control stage 622 is turned on. Consequently, the voltage at the second node b is increased, and the first N-type transistor MN1 of the auxiliary output stage 624 is turned on. Under this circumstance, the output voltage at the output terminal OUT7 of the unity-gain buffer 630 falls down from Vc to 0V.

As shown in FIG. 6B, the overall push current outputted from the output terminal OUT7 of the unity-gain buffer 630 is equal to the sum of the pull current Ipll_op from the operational amplifier OP, a first auxiliary pull current Ipll_1 from the control stage 622 and a second auxiliary pull current Ipll_2 from the auxiliary output stage 624. Consequently, the falling slew rate is enhanced.

Moreover, during the input voltage at the input terminal IN of the unity-gain buffer 600 rises up from 0V to Vc, only the operational amplifier OP generates the push current. Consequently, the output voltage at the output terminal OUT7 of the unity-gain buffer 630 slowly rises up from 0V to Vc.

Moreover, as shown in FIG. 6A, the first current source I1 may be implemented by a resistor or a P-type transistor. As shown in FIG. 6B, the second current source I2 may be implemented by a resistor or an N-type transistor.

From the above discussions, the unity-gain buffer of the present invention utilizes an auxiliary pull current and a control stage to enhance the pull current and the pull current of the auxiliary pull current. Consequently, the slew rate of the unity-gain buffer is enhanced. That is, due to the overall driving current of the control stage, the auxiliary pull current and the operational amplifier, the slew rate of the output voltage at the output terminal will be enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A unity-gain buffer, comprising:
   an operational amplifier, comprising a non-inverting input terminal, an output terminal, and an inverting input terminal, wherein the non-inverting input terminal is served as an input terminal of the unity-gain buffer, the output terminal of the operational amplifier is served as an output terminal of the unity-gain buffer, and the inverting input terminal is connected with the output terminal of the unity-gain buffer;
   a control stage, connected between the non-inverting input terminal and the output terminal of the unity-gain buffer; and
   an auxiliary output stage, connected between the control stage and the output terminal of the unity-gain buffer, wherein according to an input voltage at the input terminal of the unity-gain buffer, the control stage generates a first driving current, the auxiliary output stage generates a second driving current, and the operational amplifier generates a third driving current, so that an overall driving current outputted from the output terminal of the unity-gain buffer is equal to the sum of the first driving current, the second driving current and the third driving current.

2. The unity-gain buffer as claimed in claim 1, wherein the overall driving current is an overall push current, the first driving current is a first push current, the second driving current is a second push current, and the third driving current is a third push current.

3. The unity-gain buffer as claimed in claim 2, wherein the control stage comprises:
   a first current source, connected between a power voltage and a first node; and
   a first N-type transistor, including a gate terminal connected with the input terminal of the unity-gain buffer, a source terminal connected with the output terminal of the unity-gain buffer, and a drain terminal connected with the first node.

4. The unity-gain buffer as claimed in claim 3, wherein the auxiliary output stage comprises a first P-type transistor, including a gate terminal of the first P-type transistor connected with the first note, a source terminal of the first P-type transistor connected with the power voltage, and a drain terminal of the first P-type transistor connected with the output terminal of the unity-gain buffer.

5. The unity-gain buffer as claimed in claim 4, wherein during the input voltage at the input terminal of the unity-gain buffer rises up from a low voltage level to a high voltage level, the first N-type transistor is turned on to output the first push current from the control stage, the first P-type transistor is turned on to output the second push current from the auxiliary output stage according to a voltage at the first node, and the output terminal of the unity-gain buffer outputs the third push current rising up from the low voltage level to the high voltage level.

6. The unity-gain buffer as claimed in claim 3, wherein the first current source is a resistor, which is connected between the power voltage and the first node.

7. The unity-gain buffer as claimed in claim 3, wherein the first current source is a second P-type transistor, including a source terminal of the second P-type transistor connected with the power voltage, a drain terminal of the second P-type transistor connected with the first node, and a gate terminal of the second P-type transistor connected with a ground voltage or the input terminal of the unity-gain buffer.

8. The unity-gain buffer as claimed in claim 1, wherein the overall driving current is an overall pull current, the first driving current is a first pull current, the second driving current is a second pull current, and the third driving current is a third pull current.

9. The unity-gain buffer as claimed in claim 8, wherein the control stage comprises:
   a second current source, connected between a ground voltage and a second node; and
   a first P-type transistor, including a gate terminal connected with the input terminal of the unity-gain buffer, a source terminal connected with the output terminal of the unity-gain buffer, and a drain terminal connected with the second node.

10. The unity-gain buffer as claimed in claim 9, wherein the auxiliary output stage comprises a first N-type transistor, including a gate terminal of the first N-type transistor connected with the second node, a source terminal of the first N-type transistor connected with a ground voltage, and a drain terminal of the first N-type transistor connected with the output terminal of the unity-gain buffer.

11. The unity-gain buffer as claimed in claim 10, wherein during the input voltage at the input terminal of the unity-gain buffer falls down from a high voltage level to a low voltage level, the first P-type transistor is turned on to output the first pull current from the control stage, the first N-type transistor is turned on to output the second pull current from the auxiliary output stage according to a voltage at the second node, and the output terminal of the unity-gain buffer outputs the third pull current falling down from the high voltage level to the low voltage level.

12. The unity-gain buffer as claimed in claim 9, wherein the second current source is a resistor, which is connected between the ground voltage and the second node.

13. The unity-gain buffer as claimed in claim 9, wherein the second current source is a second N-type transistor, including a source terminal of the second N-type transistor connected with the ground voltage, a drain terminal of the second N-type transistor connected with the second node, and a gate terminal of the second N-type transistor connected with a power voltage or the input terminal of the unity-gain buffer.

14. The unity-gain buffer as claimed in claim 1, wherein the control stage comprises:
   a first current source, connected between a power voltage and a first node;
   a first N-type transistor, including a gate terminal connected with the input terminal of the unity-gain buffer, a source terminal connected with the output terminal of the unity-gain buffer, and a drain terminal connected with the first node;
   a second current source connected between a ground voltage and a second node; and
   a first P-type transistor, including a gate terminal of the first P-type transistor connected with the input terminal of the unity-gain buffer, a source terminal of the first P-type transistor connected with the output terminal of the unity-gain buffer, and a drain terminal of the first P-type transistor connected with the second node.

15. The unity-gain buffer as claimed in claim 14, wherein the auxiliary output stage comprises:
   a second P-type transistor, including a gate terminal of the second P-type transistor connected with the first note, a source terminal of the second P-type transistor connected with the power voltage, and a drain terminal of the second P-type transistor connected with the output terminal of the unity-gain buffer; and
   a second N-type transistor, including a gate terminal of the second N-type transistor connected with the second node, a source terminal of the second N-type transistor connected with a ground voltage, and a drain terminal of the second N-type transistor connected with the output terminal of the unity-gain buffer.

16. The unity-gain buffer as claimed in claim 15, wherein during the input voltage at the input terminal of the unity-gain buffer rises up from a low voltage level to a high voltage level, the first N-type transistor is turned on to output the first driving current from the control stage, the second P-type transistor is turned on to output the second driving current from the auxiliary output stage according to a voltage at the first node, and the output terminal of the unity-gain buffer outputs the third driving current rising up from the low voltage level to the high voltage level.

17. The unity-gain buffer as claimed in claim 15, wherein during the input voltage at the input terminal of the unity-gain buffer falls down from a high voltage level to a low voltage level, the first P-type transistor is turned on to output the first driving current from the control stage, the second N-type transistor is turned on to output the second driving current from the auxiliary output stage according to a voltage at the second node, and the output terminal of the unity-gain buffer outputs the third driving current falling down from the high voltage level to the low voltage level.

18. The unity-gain buffer as claimed in claim 14, wherein the first current source is a first resistor connected between the power voltage and the first node, and the second current source comprises a second resistor connected between the ground voltage and the second node.

19. The unity-gain buffer as claimed in claim 14, wherein the first current source is a third P-type transistor including a source terminal of the third P-type transistor connected with the power voltage, a drain terminal of the third P-type transistor connected with the first node, and a gate terminal of the second P-type transistor connected with the ground voltage or the input terminal of the unity-gain buffer.

20. The unity-gain buffer as claimed in claim 14, wherein the second current source is a third N-type transistor including a source terminal of the third N-type transistor connected with the ground voltage, a drain terminal of the third N-type transistor connected with the second node, and a gate terminal of the third N-type transistor connected with the power voltage or the input terminal of the unity-gain buffer.

* * * * *